(12) United States Patent
Li et al.

(10) Patent No.: US 12,211,852 B2
(45) Date of Patent: Jan. 28, 2025

(54) SEMICONDUCTOR STRUCTURE WITH A SECOND ISOLATION DAM AND MANUFACTURING METHOD THEREOF

(71) Applicant: CHANGXIN MEMORY TECHNOLOGIES, INC., Hefei (CN)

(72) Inventors: Yukun Li, Hefei (CN); Tao Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 80 days.

(21) Appl. No.: 17/604,991

(22) PCT Filed: Jun. 2, 2021

(86) PCT No.: PCT/CN2021/097888
§ 371 (c)(1),
(2) Date: Oct. 19, 2021

(87) PCT Pub. No.: WO2022/048216
PCT Pub. Date: Mar. 10, 2022

(65) Prior Publication Data
US 2023/0187448 A1    Jun. 15, 2023

(30) Foreign Application Priority Data
Sep. 4, 2020   (CN) ......................... 202010923664.0

(51) Int. Cl.
*H01L 27/12*   (2006.01)
*H01L 21/762*  (2006.01)
*H01L 21/84*   (2006.01)

(52) U.S. Cl.
CPC .... *H01L 27/1203* (2013.01); *H01L 21/76283* (2013.01); *H01L 21/84* (2013.01)

(58) Field of Classification Search
None
See application file for complete search history.

(56) References Cited

U.S. PATENT DOCUMENTS

| | | | |
|---|---|---|---|
| 8,846,486 B2 | 9/2014 | Koburger, III et al. | |
| 2014/0176216 A1* | 6/2014 | Thonnart | H01L 27/1203 257/202 |
| 2015/0179735 A1 | 6/2015 | In't Zandt et al. | |

FOREIGN PATENT DOCUMENTS

| CN | 101673715 B | 5/2012 |
|---|---|---|
| CN | 111508963 A | 8/2020 |

* cited by examiner

*Primary Examiner* — Hung K Vu
(74) *Attorney, Agent, or Firm* — Syncoda LLC; Feng Ma (57) ABSTRACT

A semiconductor structure includes a semiconductor substrate, a first isolation dam, a plurality of switching transistors and a second isolation dam. The semiconductor substrate includes a trench, an isolation region formed by a region where the trench is located, a plurality of active regions defined by the isolation region, and an electrical isolation layer, the electrical isolation layer being located on one side, away from an opening of the trench, of the trench; the first isolation dam fills the trench; the switching transistor is at least partially embedded in the active region of the semiconductor substrate; and the second isolation dam is at least partially located between the first isolation dam and the electrical isolation layer.

17 Claims, 11 Drawing Sheets

SEMICONDUCTOR STRUCTURE WITH A SECOND ISOLATION DAM AND MANUFACTURING METHOD THEREOF

CROSS-REFERENCE TO RELATED APPLICATIONS

This application is a national stage of International Application No. PCT/CN2021/097888 filed on Jun. 2, 2021, which claims priority to Chinese Patent Application No. 202010923664.0 filed on Sep. 4, 2020 The disclosures of these applications are hereby incorporated by reference in their entirety.

TECHNICAL FIELD

The present disclosure relates to the technical field of semiconductors, in particular to a semiconductor structure and a manufacturing method thereof.

BACKGROUND

As semiconductor technology evolves towards high integration, an increasing number of transistor devices are integrated inside chips of the same size. In order to reduce the load effect of etching on silicon substrates, gates of transistors originally placed on the silicon substrates are gradually replaced with embedded gates. However, due to special structures of the embedded gates, currents will move towards the substrates when channels of the devices are opened, which causes a small number of carriers to cross silicon oxide isolation dams, and leads to electric leakage consequently.

In related arts, it is common practice to deepen the silicon oxide isolation dams to prevent a leaked current, through which it will be difficult to manufacture semiconductor structures as a result, and smaller or collapsed active regions are often caused by excessively deep silicon oxide isolation dams.

It should be noted that information disclosed in the above background art is merely used to enhance understanding of the background of the present disclosure, so it can include information that does not constitute the prior art known to those of ordinary skill in the art.

SUMMARY

According to one aspect of the present disclosure, a semiconductor structure is provided. The semiconductor structure includes a semiconductor substrate, a first isolation dam, a plurality of switching transistors and a second isolation dam. The semiconductor substrate includes a trench, an isolation region formed by a region where the trench is located, a plurality of active regions defined by the isolation region, and an electrical isolation layer, the electrical isolation layer being located on one side, away from an opening of the trench, of the trench, and a trench bottom of the trench being spaced from the electrical isolation layer by a preset distance; the first isolation dam fills the trench; the switching transistor is at least partially embedded in the active region of the semiconductor substrate; and the second isolation dam is at least partially located between the first isolation dam and the electrical isolation layer.

In an exemplary embodiment of the present disclosure, the switching transistor includes a source/a drain, the second isolation dam is made from a doped semiconductor, and a doping type of the second isolation dam is different from that of the source/the drain of the switching transistor.

In an exemplary embodiment of the present disclosure, the second isolation dam is connected between the first isolation dam and the electrical isolation layer in an abutting manner.

In an exemplary embodiment of the present disclosure, an orthographic projection of a side surface, facing the electrical isolation layer, of the first isolation dam on the electrical isolation layer is located on an orthographic projection of the second isolation dam on the electrical isolation layer.

In an exemplary embodiment of the present disclosure, the width of the second isolation dam is 1.2-1.5 times of the width of an opening of a top of the trench, and a direction of the width is perpendicular to a side wall of the trench.

In an exemplary embodiment of the present disclosure, a distance between a side surface, facing the electrical isolation layer, of the first isolation dam and a side surface, facing the electrical isolation layer, of the second isolation dam is greater than or equal to 15 nm.

In an exemplary embodiment of the present disclosure, the height of the first isolation dam is 4-5 times of the height of the second isolation dam, a direction of the height is perpendicular to a plane where the electrical isolation layer is located.

In an exemplary embodiment of the present disclosure, one end, facing the electrical isolation layer, of the first isolation dam is embedded in the second isolation dam.

In an exemplary embodiment of the present disclosure, the active region of the semiconductor substrate is provided with a recess, the recess and the trench are provided on the same side surface of the semiconductor substrate, and the switching transistor includes: a channel portion, a gate insulation layer, a gate and a source/a drain, where the channel portion is embedded at one side, away from an opening of the recess, of the recess; the gate insulation layer covers one side, away from the electrical isolation layer, of the recess according to a shape of the side of the recess; the gate is arranged on one side, away from the electrical isolation layer, of the gate insulation layer and is located in the recess; and the source and the drain are embedded in the active region and located on two opposite sides of the gate insulation layer, and the source/the drain are respectively connected to the channel portion.

In an exemplary embodiment of the present disclosure, the electrical isolation layer is made from a doped semiconductor, and a doping type of the electrical isolation layer is different from that of the source/the drain of the switching transistor.

According to one aspect of the present disclosure, a method of manufacturing a semiconductor structure is provided. The method of manufacturing a semiconductor structure includes:

forming a semiconductor substrate, where the semiconductor substrate includes a trench, an isolation region formed by a region where the trench is located, a plurality of active regions defined by the isolation region, and an electrical isolation layer; the electrical isolation layer is located on one side, away from an opening of the trench, of the trench, and a trench bottom of the trench is spaced from the electrical isolation layer by a preset distance;

filling the trench with an insulation material, so as to form a first isolation dam;

forming a plurality of switching transistors in the active region of the semiconductor substrate, the switching transistor being at least partially embedded in the active region of the semiconductor substrate; and forming a second isolation dam at least partially located between the first isolation dam and the electrical isolation layer.

In an exemplary embodiment of the present disclosure, the forming a second isolation dam includes:

performing ion doping on a first structure portion of the semiconductor substrate, so as to form the first structure portion into at least a portion of the second isolation dam, wherein the first structure portion is located between the first isolation dam and the electrical isolation layer; and the switching transistor includes a source/a drain, and a doping type of the second isolation dam is different from that of the source/the drain of the switching transistor.

In an exemplary embodiment of the present disclosure, the forming a second isolation dam further includes:

defining a width of the second isolation dam by using a mask, where the width of the second isolation dam is greater than a width of an opening of a top of the trench, and a direction of the width is perpendicular to a side wall of the trench.

In an exemplary embodiment of the present disclosure, the width of the second isolation dam is 1.2-1.5 times of the width of an opening of a top of the trench.

In an exemplary embodiment of the present disclosure, the forming a second isolation dam further includes:

performing ion doping on a second structure portion of the semiconductor substrate, so as to form the second structure portion into at least a portion of the second isolation dam; wherein, one end, facing the electrical isolation layer, of the first isolation dam is embedded in the second structure portion.

In an exemplary embodiment of the present disclosure, a distance between a side surface, facing the electrical isolation layer, of the first isolation dam and a side surface, facing the electrical isolation layer, of the second isolation dam is greater than or equal to 15 nm.

In an exemplary embodiment of the present disclosure, the height of the first isolation dam is 4-5 times of the height of the second isolation dam, a direction of the height is perpendicular to a plane where the electrical isolation layer is located.

In an exemplary embodiment of the present disclosure, before the forming the trench, the method of manufacturing a semiconductor structure further includes:

forming a recess in the active region; and depositing a gate insulation layer in the recess according to a shape of the recess, and forming a gate on one side, away from the electrical isolation layer, of the gate insulation layer, the gate being located in the recess.

In an exemplary embodiment of the present disclosure, forming a plurality of switching transistors in the active region of the semiconductor substrate includes:

forming a channel portion on one side, away from the opening of the trench, of the trench by ion implantation technology; and forming a portion of the semiconductor substrate into the source/the drain of the switching transistor by the ion implantation technology;

The source and the drain are embedded in the active region and located on two opposite sides of the gate insulation layer, and the source/the drain are respectively connected to the channel portion.

It should be understood that the above general description and the following detailed description are merely exemplary and explanatory, and cannot limit the present disclosure.

BRIEF DESCRIPTION OF THE DRAWINGS

Accompanying drawings described herein are incorporated in the specification and constitute a portion of the specification, embodiments consistent with the present disclosure are described, and are used to explain principles of the present disclosure together with the specification. Apparently, the accompanying drawings in the following descriptions are merely some embodiments of the present disclosure, and a person of ordinary skill in the art may still derive other accompanying drawings from the accompanying drawings without creative efforts.

DETAILED DESCRIPTION

Exemplary embodiments are described herein more fully with reference to accompanying drawings. However, the exemplary embodiments may be implemented in many forms and should not be construed as limited to examples set forth herein. On the contrary, by providing these embodiments, the present disclosure will be more thorough and complete, and concepts of the exemplary embodiments will be fully communicated to a person of ordinary skill in the art. In the drawings, the same reference numerals denote the same or similar structures, and therefore their detailed description are omitted.

Although relative terms, for example "upper" and "lower", are used in the specification to describe a relative relationship between one component of an icon and another component, using these terms in the specification is merely for convenience. For example, according to exemplary directions described in the accompanying drawings, it can be understood that if an apparatus of the icon is turned upside down, a component described in "upper" will become a component described in "lower". Other relative terms, for example "high", "low", "top", "bottom", "left" and "right", etc., also have similar meanings. When some structure is "on" other structures, it may mean that some structure is integrally formed on other structures, or that some structure is "directly" arranged on other structures, or that some structure is "indirectly" arranged on other structures by another structure.

The terms "a", "an" and "the" are used to indicate existence of one or more elements/components/etc. The terms "including" and "is/are provided with" are used to mean inclusive and mean that there may be other elements/components/etc. besides the listed elements/components/etc.

Figure 1:
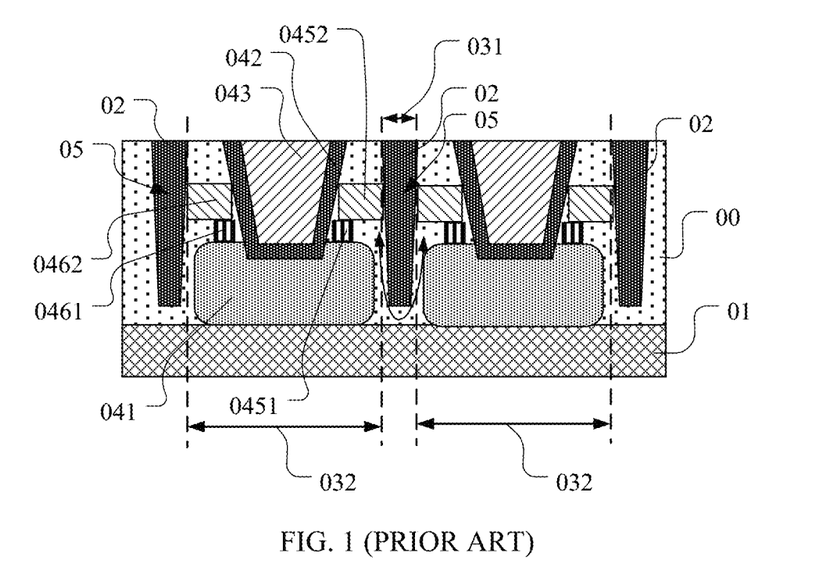
FIG. 1 is a structural schematic diagram of an exemplary embodiment of a semiconductor structure in related art.

FIG. 1 is a structural schematic diagram of an exemplary embodiment of a semiconductor structure in related art. The semiconductor structure includes a semiconductor substrate 00, a first isolation dam 02 and a plurality of switching transistors. The semiconductor substrate includes a trench 05, an isolation region 031 formed by a region where the trench 05 is located, a plurality of active regions 032 defined by the isolation region 031, and an electrical isolation layer 01, the electrical isolation layer 01 being located on one side, away from an opening of the trench, of the trench 05. The first isolation dam 02 fills the trench 05. The switching transistor is embedded in the active region 032 of the semiconductor substrate 00, and the switching transistor may include a channel portion 041, a gate insulation layer 042, a gate 043, a first source/drain portion and a second source/drain portion. As shown in FIG. 1, the first source/drain portion may include a first lightly doped portion 0461 and a first heavily doped portion 0462, and the second source/drain portion may include a second lightly doped portion 0451 and a second heavily doped portion 0452. The first isolation dam 02 may be made from an insulation material, for example silicon oxide, etc., and the first isolation dam 02 may be used to block electrical leakage, out of the active region 032, of the switching transistor located in the active region 032. However, as shown in FIG. 1, the channel portion 041 of the switching transistor is relatively close to the electrical isolation layer 01. When the switching transistor conducts electricity, a current flowing through the channel portion 041 of the switching transistor is prone to leakage from between the first isolation dam 02 and the electrical isolation layer 01, and a direction of the leaked current may be shown by an arrow in FIG. 1.

Figure 2:
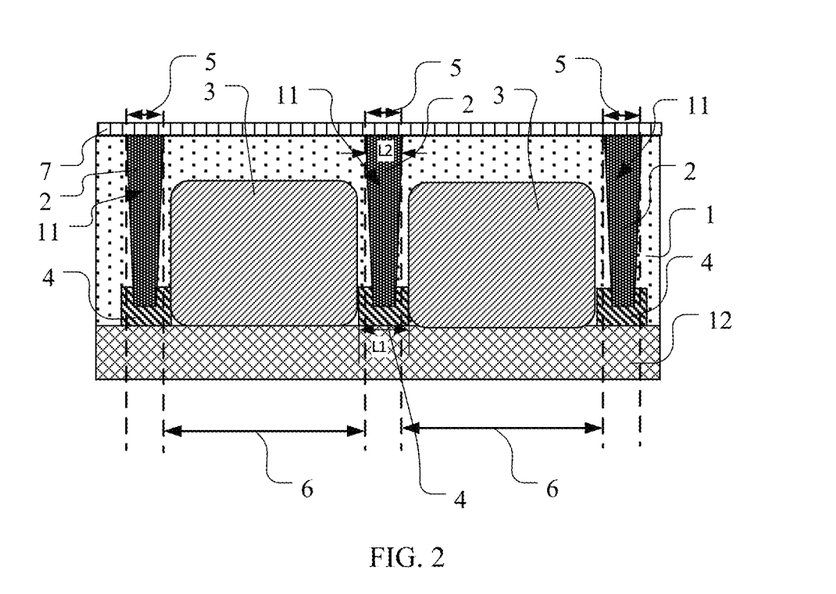
FIG. 2 is a structural schematic diagram of an exemplary embodiment of a semiconductor structure of the present disclosure.

Based on this, this exemplary embodiment provides a semiconductor structure. FIG. 2 is a structural schematic diagram of an exemplary embodiment of the semiconductor structure of the present disclosure. The semiconductor structure may include: a semiconductor substrate 1, a first isolation dam 2, a plurality of switching transistors 3 and a second isolation dam 4. The semiconductor substrate 1 may include a trench 11, an isolation region 5 formed by a region where the trench 11 is located, a plurality of active regions 6 defined by the isolation region 5, and an electrical isolation layer 12, the electrical isolation layer 12 being located on one side, away from an opening of the trench, of the trench 11, and a trench bottom of the trench 11 being spaced from the electrical isolation layer 12 by a preset distance. The first isolation dam 2 fills the trench 11. The switching transistor 3 is at least partially embedded in the active region 6 of the semiconductor substrate, and the second isolation dam 4 is at least partially located between the first isolation dam 2 and the electrical isolation layer 12.

In the semiconductor structure provided by this exemplary embodiment, since the trench bottom of the trench 11 is spaced from the electrical isolation layer 12 by the preset distance, a leaked current of the switching transistor is prone to leakage from between the first isolation dam 02 and the electrical isolation layer 01. The second isolation dam 4 in this exemplary embodiment may be used to block the leaked current of the switching transistor 3, thereby avoiding the leaked current of the switching transistor.

It should be noted that, in this exemplary embodiment, as shown in FIG. 2, the isolation region 5 may indicate a spatial region which may penetrate the entire semiconductor substrate 1 in a layer direction. The active region 6 may also indicate a spatial region which may penetrate the entire semiconductor substrate 1 in a layer direction.

In this exemplary embodiment, as shown in FIG. 2, the semiconductor substrate 1 may be made from semiconductor materials, for example silicon, a silicon-on-insulator (SOI), germanium, gallium arsenide, etc. The first isolation dam 2 may be made from an insulating material, for example silicon oxide. The electrical isolation layer 12 may be made from a doped semiconductor subjected to ion doping, and a doping type of the electrical isolation layer is different from that of a source/a drain of the switching transistor. For example, when the switching transistor is an N-type switching transistor, the electrical isolation layer 12 may be made from a semiconductor material subjected to P-type ion doping, and when the switching transistor is a P-type switching transistor, the electrical isolation layer 12 may be made from a semiconductor material subjected to N-type ion doping.

In this exemplary embodiment, the second isolation dam 4 is used to block the leaked current of the switching transistor. The second isolation dam 4 may be made from a semiconductor material subjected to ion doping, and the switching transistor may include a source/a drain. A doping type of the second isolation dam is different from that of the source/the drain of the switching transistor. For example, when the doping type of the source/the drain of the switching transistor is P-type doping, the second isolation dam 4 may be made from a semiconductor material subject to N-type ion doping. When the doping type of the source/the drain of the switching transistor is N-type doping, the second isolation dam 4 may be made from a semiconductor material subjected to P-type ion doping. Since the doping type of the second isolation dam is different from that of the source/the drain of the switching transistor, a carrier for transport between the source and the drain of the switching transistor is different from a type of a majority carrier of the second isolation dam 4 (one carrier is a hole and the other carrier is an electron). When the carrier for transport between the source and the drain of the switching transistor flows to the second isolation dam 4, the carrier for transport between the source and the drain of the switching transistor combines with the majority carrier of the second isolation dam 4, thus blocking the leaked current of the switching transistor.

It should be understood that in other exemplary embodiments, the second isolation dam 4 may also be made from other materials, for example, the second isolation dam 4 may be made from an insulation material.

Figure 3:
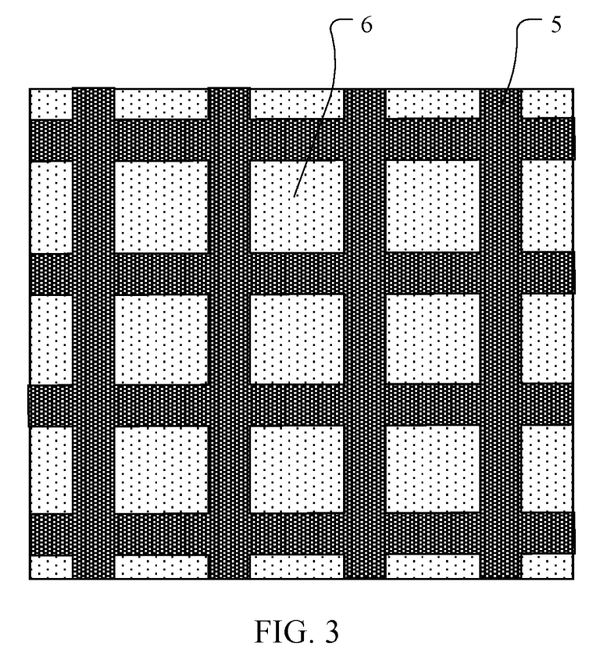
FIG. 3 is a top view of FIG. 2.
Figure 4:
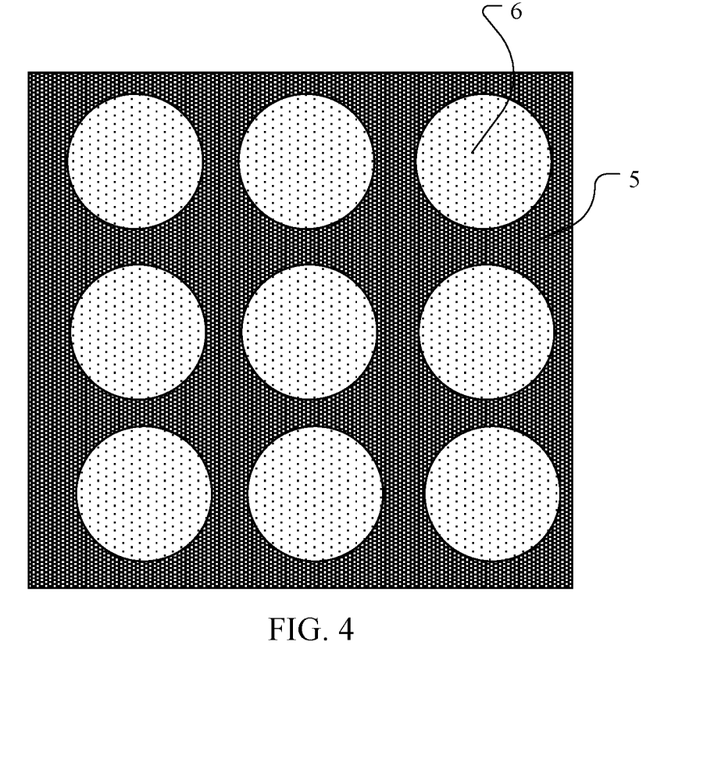
FIG. 4 is a top view of another exemplary embodiment of the semiconductor structure of the present disclosure.

FIG. 3 is a top view of FIG. 2. In this exemplary embodiment, the active regions 6 are isolated into mutually isolated sections by the isolation region 5. The active region 6 may be rectangular, and correspondingly, the trench on the semiconductor substrate 1 may be formed by a plurality of intersecting strip-shaped sub-trenches. It should be understood that in other exemplary embodiments, the active region 6 may also in other shapes. For example, FIG. 4 is a top view of another exemplary embodiment of the semiconductor structure of the present disclosure, the active region 6 may also in a circular shape.

In this exemplary embodiment, as shown in FIG. 2, the second isolation dam 4 may be connected between the first isolation dam 2 and the electrical isolation layer 12 in an abutting manner. That is, the second isolation dam 4, the first isolation dam 2 and the electrical isolation layer 12 may be provided with a plurality of recess structures, and side walls of the recess structures are all sealed structures, which may completely block a current leakage path of the switching transistor. It should be understood that in other exemplary embodiments, the second isolation dam 4 may also be located between the first isolation dam 2 and the electrical isolation layer 12, the second isolation dam 4 is not connected to the first isolation dam 2 in an abutting manner and/or the second isolation dam 4 is not connected to the electrical isolation layer 12 in an abutting manner, and the structure may still play a certain role in blocking the leaked current.

In this exemplary embodiment, as shown in FIG. 2, an orthographic projection of a side surface, facing the electrical isolation layer 12, of the first isolation dam 2 on the electrical isolation layer 12 is located on an orthographic projection of the second isolation dam 4 on the electrical isolation layer 12. That is, a width of the second isolation dam 4 is greater than or equal to a width of a bottom of the first isolation dam 2, and a direction of the width is perpendicular to a side wall of the trench. The second isolation dam 4 with a relatively great with may enhance the leaked current blocking effect of the second isolation dam 4.

In this exemplary embodiment, as shown in FIG. 2, the width L1 of the second isolation dam may be 1.2-1.5 times of a width L2 of an opening of a top of the trench, and a direction of the width is perpendicular to the side wall of the trench. A distance between a side surface, facing the electrical isolation layer 12, of the first isolation dam 2 and a side surface, facing the electrical isolation layer, of the second isolation dam 4 is greater than or equal to 15 nm. That is, a distance between of a bottom of the first isolation dam 2 and a bottom of the second isolation dam 4 may be greater than or equal to 15 nm. The height of the first isolation dam 2 may be 4-5 times of the height of the second isolation dam 4, a direction of the height is perpendicular to a plane where the electrical isolation layer is located. One end, facing the electrical isolation layer 12, of the first isolation dam 2 may be embedded in the second isolation dam, which may wrap a portion of the second isolation dam 4 in a side surface of the bottom of the first isolation dam 2, thus enhancing the leaked current blocking effect of the second isolation dam 4.

Figure 5:
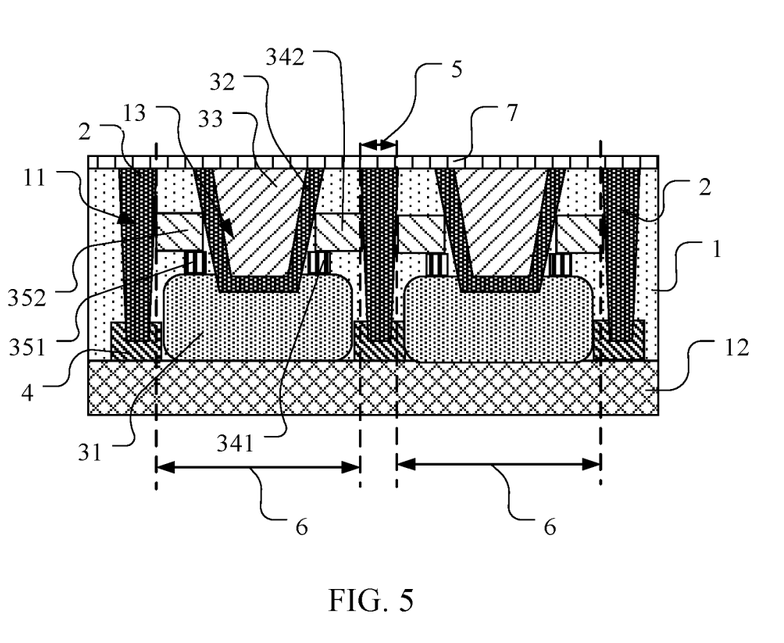
FIG. 5 is a structural schematic diagram of another exemplary embodiment of the semiconductor structure of the present disclosure.

In this exemplary embodiment, FIG. 5 is a structural schematic diagram of another exemplary embodiment of the semiconductor structure of the present disclosure. The active region 6 of the semiconductor substrate may be provided with a recess 13, and the recess 13 and the trench 11 may be provided on the same side surface of the semiconductor substrate 1. The switching transistor may include: a channel portion 31, a gate insulation layer 32, a gate 33 and a source/a drain, where the channel portion 31 is at least partially embedded at one side, away from an opening of the recess, of the recess 13, the gate insulation layer 32 covers one side, away from the electrical isolation layer 12, of the recess 13 according to a shape of the side of the recess, and the gate 33 may be arranged on one side, away from the electrical isolation layer 12, of the gate insulation layer 32 and is located in the recess 13. The source/the drain may include: a first source/a first drain and a second source/a second drain, and in the first source/the first drain and the second source/the second drain, one is a source of the switching transistor, and the other is a drain of the switching transistor. As shown in FIG. 5, the first source/the first drain may include a first lightly doped source/a first lightly doped drain 351 and a first heavily doped source/a first heavily doped drain 352, the first lightly doped source/the first lightly doped drain 351 is connected to a first side of the channel portion 31, and the first heavily doped source/the first heavily doped drain 352 is connected to the first lightly doped source/the first lightly doped drain 351. An ion doping concentration of the first heavily doped source/the first heavily doped drain 352 is greater than that of the first lightly doped source/the first lightly doped drain 351, and a doping type of the first lightly doped source/the first lightly doped drain 351 and a doping type of the first heavily doped source/the first heavily doped drain 352 are the same. The second source/the second drain may include: a second lightly doped source/a second lightly doped drain 341 and a second heavily doped source/a second heavily doped drain 342. The second lightly doped source/the second lightly doped drain 341 is connected to a second side of the channel portion 31, and the first side and the second side of the channel portion are opposite each other, that is, an orthographic projection of the gate 33 on a plane where the channel portion 31 is located is located between the first side and the second side of the channel portion. The second heavily doped source/the second heavily doped drain 342 is connected to the second lightly doped source/the second lightly doped drain 341. An ion doping concentration of the second heavily doped source/the second heavily doped drain 342 is greater than that of the second lightly doped source/the second lightly doped drain 341, and a doping type of the second heavily doped source/the second heavily doped drain 342 and a doping type of the second lightly doped source/the second lightly doped drain 341 are the same. The first source/the first drain is set to include the first lightly doped source/the first lightly doped drain 351 and the first heavily doped source/the first heavily doped drain 352, and the second source/the second drain is set to include the second lightly doped source/the second lightly doped drain 341 and the second heavily doped source/the second heavily doped drain 342, which may prevent a hot electron degradation effect in the channel portion of the switching transistor.

As shown in FIGS. 2 and 5, the semiconductor structure may further include an encapsulation layer 7, the encapsulation layer 7 may cover one side, provided with the trench 11, of the semiconductor substrate 1, and the encapsulation layer 7 may be made from silicon nitride, which has relatively strong hardness and may protect the semiconductor structure.

Figure 6:
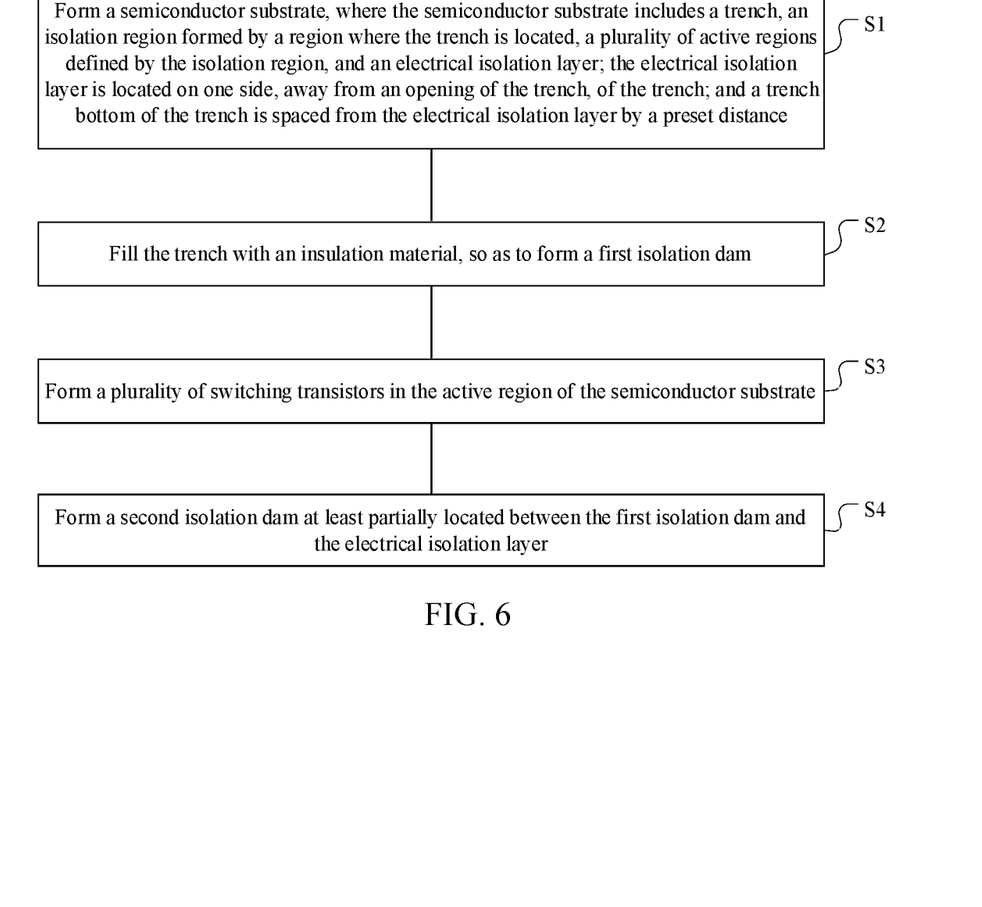
FIG. 6 is a flowchart of an exemplary embodiment of a method of manufacturing a semiconductor structure of the present disclosure.

This exemplary embodiment further provides a method of manufacturing a semiconductor structure. FIG. 6 is a flowchart of an exemplary embodiment of the method of manufacturing a semiconductor structure of the present disclosure. The method of manufacturing a semiconductor structure may include:

S1: form a semiconductor substrate, where the semiconductor substrate includes a trench, an isolation region formed by a region where the trench is located, a plurality of active regions defined by the isolation region, and an electrical isolation layer, the electrical isolation layer being located on one side, away from an opening of the trench, of the trench, and a trench bottom of the trench being spaced from the electrical isolation layer by a preset distance;

S2: fill the trench with an insulation material, so as to form a first isolation dam;

S3: form a plurality of switching transistors in the active region of the semiconductor substrate, the switching transistor being at least partially embedded in the active region of the semiconductor substrate; and S4: form a second isolation dam at least partially located between the first isolation dam and the electrical isolation layer.

Figure 7:
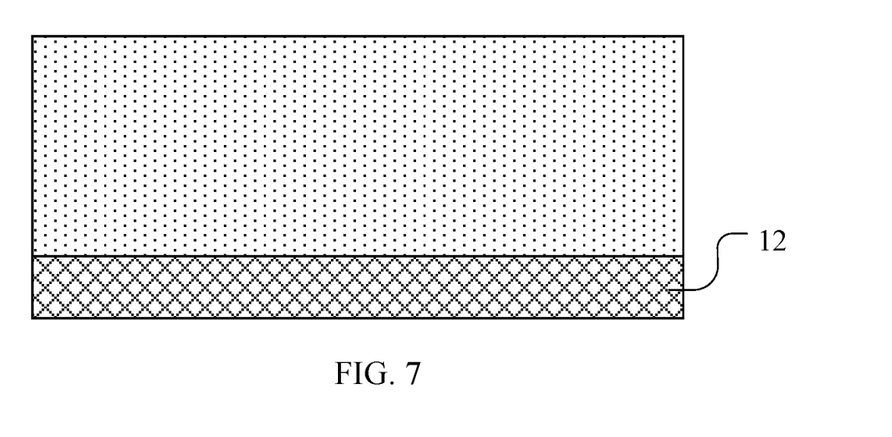
FIGS. 7-13 and FIG. 15 are a process flowchart of a semiconductor structure of an exemplary embodiment of the method of manufacturing a semiconductor structure of the present disclosure.

The following describes the steps above in detail:
as shown in FIG. 7, the forming a semiconductor substrate in S1 may include: provide a semiconductor substrate;

and perform ion implantation on the semiconductor substrate to form the electrical isolation layer 12 in the semiconductor substrate. The semiconductor substrate may be made from semiconductor materials, for example silicon, a silicon-on-insulator (SOI), germanium, gallium arsenide, etc. The performing ion implantation on the semiconductor substrate may include perform N-type ion implantation or P-type ion implantation on the semiconductor substrate. When the switching transistor is a P-type switching transistor, the performing ion implantation on the semiconductor substrate may include perform N-type ion implantation on the semiconductor substrate. When the switching transistor is an N-type switching transistor, the performing ion implantation on the semiconductor substrate may include perform P-type ion implantation on the semiconductor substrate. The electrical isolation layer 12 may be a lightly doped semiconductor.

Figure 8:
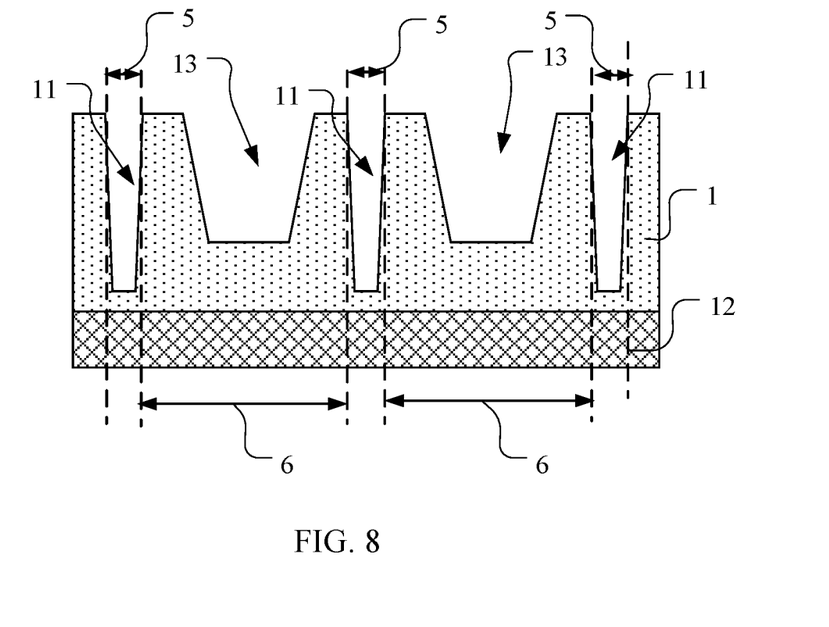

As shown in FIG. 8, the forming a semiconductor substrate in S1 may further includes: form a trench 11 on one side of the semiconductor substrate, form an isolation region 5 by a region where the trench 11 is located, define a plurality of active regions 6 by the isolation region 5, and space a trench bottom of the trench 11 from the electrical isolation layer 12 by a preset distance. As shown in FIG. 8, before the forming the trench 11, the method of manufacturing a semiconductor structure may further include: form a recess 13 on the active region 6, the recess 13 and the trench 11 being provided on the same side surface of the semiconductor substrate 1. The recess 13 and the trench 11 may be formed by photolithography, and an etching process may use dry etching, and etching gas may be $C_4F_6$. After the recess 13 is formed by photolithography, it is necessary to fill the recess 13 with photoresist to form a mask for etching the trench 11. After the trench 11 is etched, it is also necessary to clean the photoresist filling the recess 13. In view of the fact that the trench 11 is deeper than the recess 13, in this exemplary embodiment, the recess 13 is firstly etched by photolithography, and then the trench 11 is etched by photolithography, which facilitates cleaning of the photoresist after the recess 13 and the trench 11 are etched. It should be noted that, in this exemplary embodiment, as shown in FIG. 8, the isolation region 5 may indicate a spatial region which may penetrate the entire semiconductor substrate 1 in a layer direction. The active region 6 may also indicate a spatial region which may penetrate the entire semiconductor substrate 1 in a layer direction.

Figure 9:
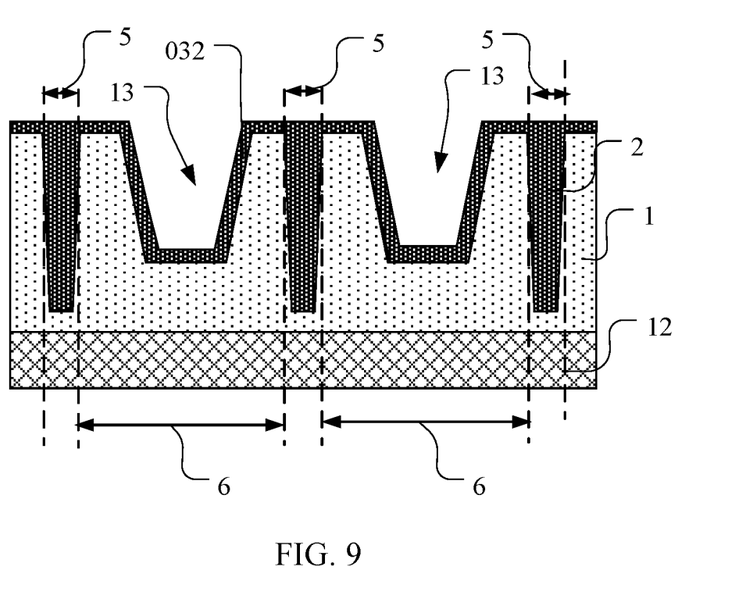

As shown in FIG. 9, S2 may include: fill the trench with an insulation material, so as to form a first isolation dam 2. In this exemplary embodiment, as shown in FIG. 9, before or after filling the trench with an insulation material, so as to form a first isolation dam 2, an insulation material layer 032 may be deposited on one side, provided with the recess 13, of the semiconductor substrate 1 according to a shape of the side of the recess. The insulation material layer 032 may be made from an insulating material, for example silicon oxide. The insulation material layer 032 may use deposition methods of chemical vapor deposition (CVD), atomic layer deposition (ALD), etc.

Figure 10:
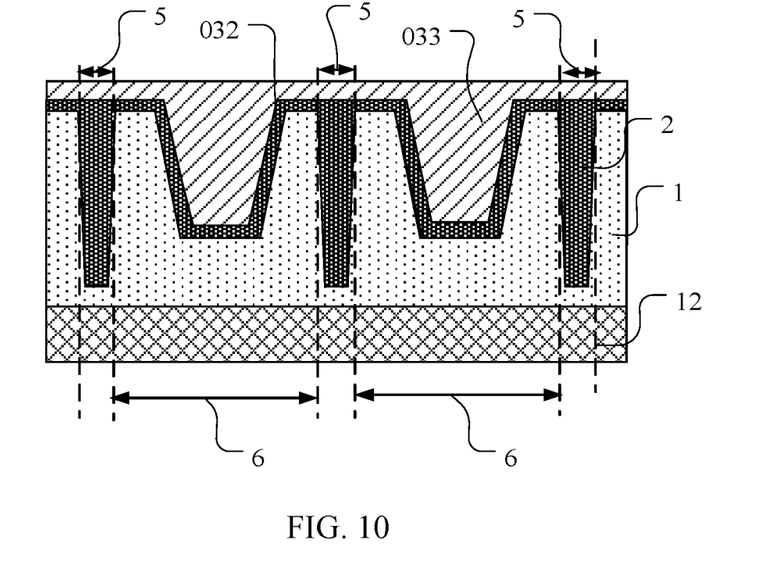

As shown in FIG. 10, the method of manufacturing a semiconductor structure may further include: form a gate material layer 033 on one side, away from the electrical isolation layer 12, of the insulation material layer 032. The gate material layer 033 may use deposition methods of chemical vapor deposition (CVD), atomic layer deposition (ALD), etc. The gate material layer 033 may be made from a doped polysilicon conductor.

Figure 11:
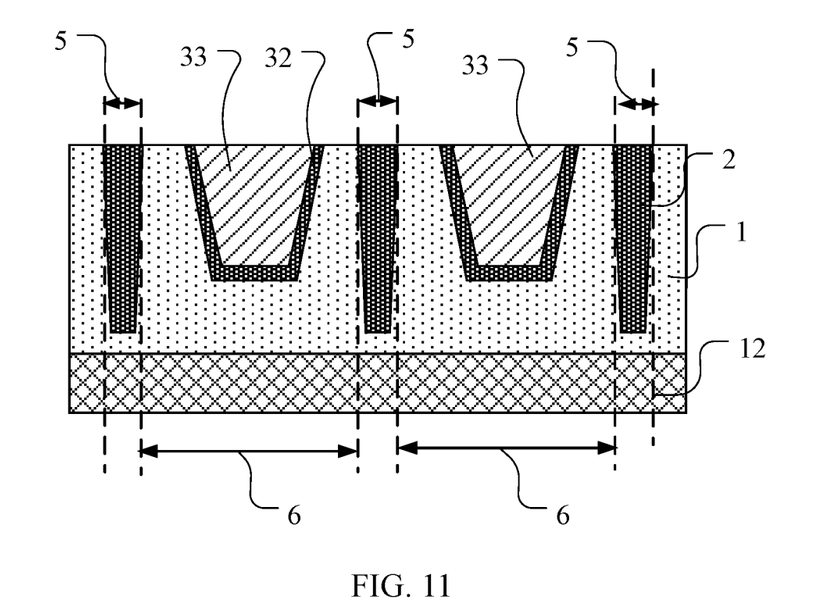

As shown in FIG. 11, the method of manufacturing a semiconductor structure may further include: perform etching back, chemical mechanical polishing (CMP), cleaning, etc. on the gate material layer 033 and the insulation material layer 032, so as to form a portion of the insulation material layer 032 into gate insulation layers 32 of the plurality of switching transistors, and to form a portion of the gate material layer 033 into the gates 33 of the plurality of switching transistors, where the gate insulation layers 32 of each switching transistor are arranged independently of one another and the gates 33 of each switching transistor are arranged independently of one another.

Figure 12:
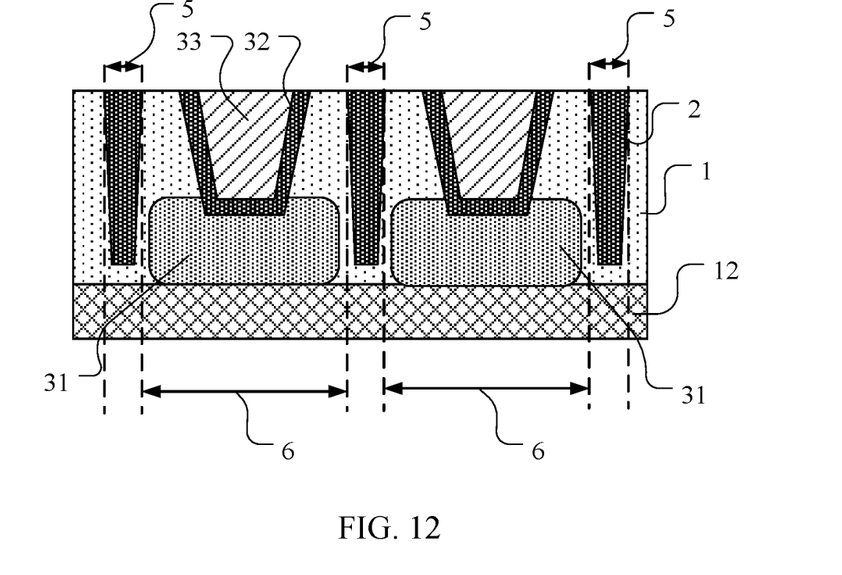

As shown in FIG. 12, the method of manufacturing a semiconductor structure may further include: arrange a mask on an upper surface of the semiconductor structure shown in FIG. 12, and form a portion of the semiconductor substrate into a channel portion 31 of the switching transistor by an ion implantation technology. A doping type of the channel portion 31 may be the same as that of the electrical isolation layer 12. Specifically, the ion implantation technology may provide initial energy for doped ions, and the doped ions may reach a preset depth of the semiconductor substrate under the action of the initial energy, such that a target depth of the semiconductor substrate may be subjected to ion doping. In addition, the mask may block entering of the ions into the semiconductor substrate, so a target position of the semiconductor substrate may be subjected to ion doping by combining an opening shape of the mask and the initial energy of the ions.

Figure 13:
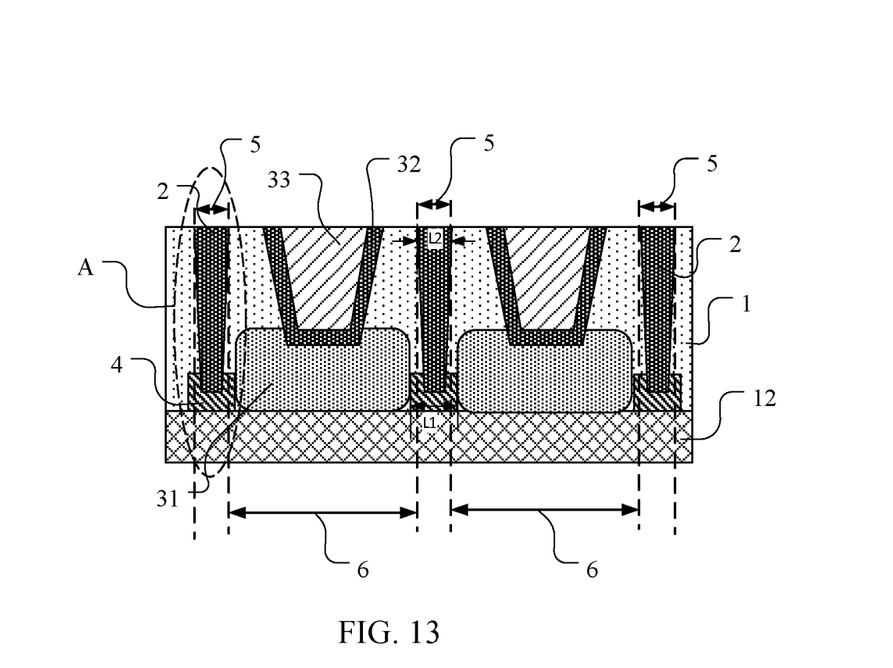

As shown in FIG. 13, the method of manufacturing a semiconductor structure may further include: arrange the mask on the upper surface of the semiconductor structure shown in FIG. 13, and form a portion of the semiconductor substrate into a second isolation dam 4 by an ion implantation manner. A doping type of the second isolation dam is different from that of the source/the drain of the switching transistor.

Figure 14:
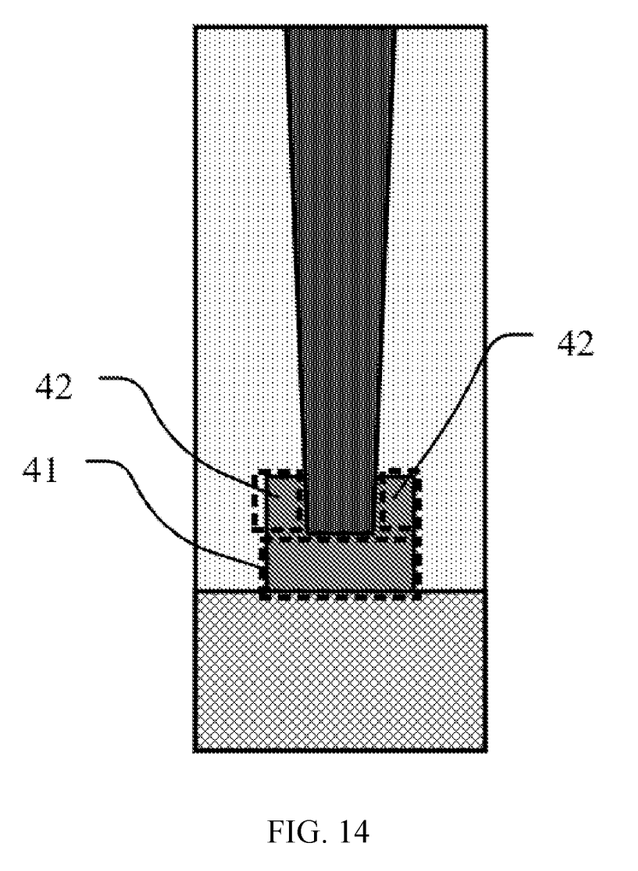
FIG. 14 is a partial enlarged diagram of FIG. 13.

In this exemplary embodiment, FIG. 14 is a partial enlarged diagram of FIG. 13, and FIG. 14 shows a partial enlarged diagram of position A of an oval dashed box in FIG. 13. The forming a portion of the semiconductor substrate into a second isolation dam 4 by an ion implantation manner may include: perform ion doping on a first structure portion 41 of the semiconductor substrate, so as to form the first structure portion 41 into at least a portion of the second isolation dam 4, where the first structure portion 41 may be located between the first isolation dam and the electrical isolation layer, and the first structure portion 41 may be connected between the electrical isolation layer and the first isolation dam 2 in an abutting manner.

As shown in FIG. 14, the forming a portion of the semiconductor substrate into a second isolation dam 4 by an ion implantation manner may further include: perform ion doping on a second structure portion 42 of the semiconductor substrate, so as to form the second structure portion 42 into at least a portion of the second isolation dam 4, one end, facing the electrical isolation layer, of the first isolation dam 2 being embedded in the second structure portion 42. The second isolation dam 4 may be composed of the first structure portion 41 subjected to ion doping and the second structure portion 42 subjected to ion doping.

It should be noted that after the first structure portion 41 of the semiconductor substrate is subjected to ion doping, so as to form the first structure portion 41 into a portion of the second isolation dam 4, the ion implantation technology may be stopped, and doped ions implanted into the first structure portion 41 may move, by diffusion, to a position where the second structure portion 42 is located, thereby forming the second structure portion 42 into a portion of the second isolation dam 4.

In this exemplary embodiment, as shown in FIG. 13, a width L1 of the second isolation dam may be greater than a width L2 of an opening of a top of the trench. The width L1 of the second isolation dam may be 1.2-1.5 times of a width L2 of the opening of the top of the trench, and a direction of the width is perpendicular to the side wall of the trench. A distance between a side surface, facing the electrical isolation layer 12, of the first isolation dam 2 and a side surface, facing the electrical isolation layer, of the second isolation dam 4 is greater than or equal to 15 nm. That is, a distance between of a bottom of the first isolation dam 2 and a bottom of the second isolation dam 4 is greater than or equal to 15 nm. The height of the first isolation dam 2 may be 4-5 times of the height of the second isolation dam 4, a direction of the height is perpendicular to a plane where the electrical isolation layer is located. The width of the second isolation dam may be defined by the mask, that is, a width of an opening of the mask equals the width of the second isolation dam.

Figure 15:
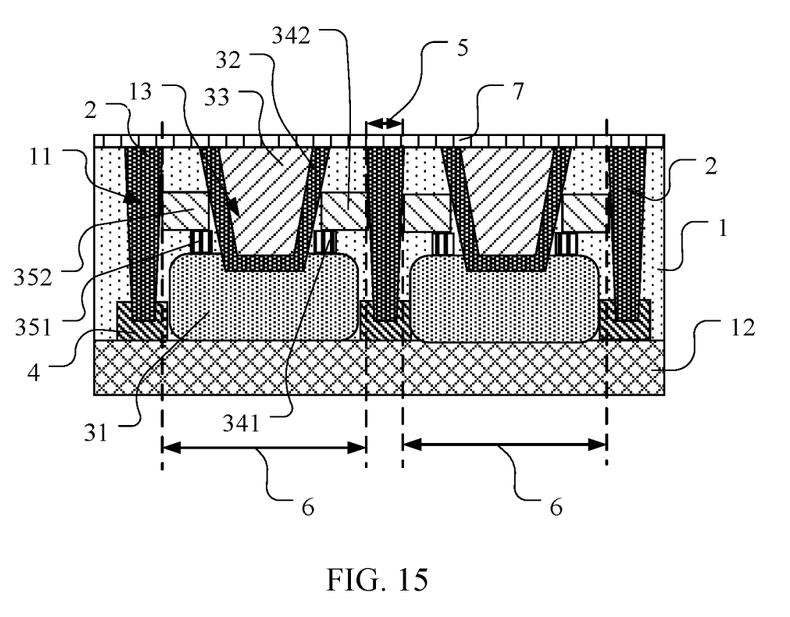

As shown in FIG. 15, the method of manufacturing a semiconductor structure may further includes: form a portion of the semiconductor substrate into a first source/a first drain and a second source/a second drain of the switching transistor by an ion implantation technology, where the source and the drain are embedded in the active region and located on two opposite sides of the gate insulation layer, and the source/the drain are respectively connected to the channel portion. As shown in FIG. 15, the first source/the first drain may include a first lightly doped source/a first lightly doped drain 351 and a first heavily doped source/a first heavily doped drain 352, the first lightly doped source/the first lightly doped drain 351 is connected to a first side of the channel portion 31, and the first heavily doped source/the first heavily doped drain 352 is connected to the first lightly doped source/the first lightly doped drain 351. An ion doping concentration of the first heavily doped source/the first heavily doped drain 352 is greater than that of the first lightly doped source/the first lightly doped drain 351, and a doping type of the first lightly doped source/the first lightly doped drain 351 and a doping type of the first heavily doped source/the first heavily doped drain 352 are the same. The second source/the second drain may include: a second lightly doped source/a second lightly doped drain 341 and a second heavily doped source/a second heavily doped drain 342. The second lightly doped source/the second lightly doped drain 341 is connected to a second side of the channel portion 31, and the first side and the second side of the channel portion are opposite each other, that is, an orthographic projection of the gate 33 on a plane where the channel portion 31 is located is located between the first side and the second side of the channel portion. The second heavily doped source/the second heavily doped drain 342 is connected to the second lightly doped source/the second lightly doped drain 341. An ion doping concentration of the second heavily doped source/the second heavily doped drain 342 is greater than that of the second lightly doped source/ the second lightly doped drain 341, and a doping type of the second heavily doped source/the second heavily doped drain 342 and a doping type of the second lightly doped source/the second lightly doped drain 341 are the same.

As shown in FIG. 15, the method of manufacturing a semiconductor structure may further include: covering one side, provided with the trench 11, of the semiconductor substrate 1 with an encapsulation layer 7, where the encapsulation layer 7 may be made from silicon nitride, which has relatively strong hardness and may protect the semiconductor structure.

It will become easy for a person of ordinary skill in the art to conceive of other embodiments of the present disclosure after considering the specification and implementing contents disclosed herein. The present disclosure is intended to cover any modification, use or adaptive change of the present disclosure, which follows general principles of the present disclosure and includes common knowledge or conventional technical means in the technical field not disclosed in the present disclosure. The specification and the embodiments are merely regarded as exemplary, with a true scope and spirit of the present disclosure being indicated by the claims.

It should be understood that the present disclosure is not limited to precise structures described above and shown in the accompanying drawings, and various modifications and changes can be made without departing from the scope of the present disclosure. The scope of the present disclosure is merely limited by the appended claims.

What is claimed is:

1. A semiconductor structure, comprising:
a semiconductor substrate; wherein the semiconductor substrate comprises a trench, an isolation region formed by a region where the trench is located, a plurality of active regions defined by the isolation region, and an electrical isolation layer; the electrical isolation layer is located on one side, away from an opening of the trench, of the trench; and a trench bottom of the trench is spaced from the electrical isolation layer by a preset distance; and the active region is provided with a recess, the recess and the trench are provided on the same side surface of the semiconductor substrate;
a first isolation dam filling the trench;
a plurality of switching transistors, wherein each of the switching transistors is at least partially embedded in one of the plurality of active regions of the semiconductor substrate; each of the switching transistors comprises a channel portion and a source/a drain, wherein the channel portion embedded at one side, away from an opening of the recess, of the recess, the source/the drain may include: a first source/a first drain and a second source/a second drain; the first source/the first drain may include a first lightly doped source/a first lightly doped drain and a first heavily doped source/a first heavily doped drain, the first lightly doped source/ the first lightly doped drain is connected to a first side of the channel portion, and the first heavily doped source/the first heavily doped drain is connected to the first lightly doped source/the first lightly doped drain; the second source/the second drain may include: a second lightly doped source/a second lightly doped drain and a second heavily doped source/a second heavily doped drain, the second lightly doped source/ the second lightly doped drain is connected to a second side of the channel portion, and the second heavily doped source/the second heavily doped drain is connected to the second lightly doped source/the second lightly doped drain; and the first side and the second side of the channel portion are opposite each other;
a second isolation dam at least partially located between the first isolation dam and the electrical isolation layer; one end, facing the electrical isolation layer, of the first isolation dam is embedded in the second isolation dam; a doping type of the second isolation dam is different from a doping type of the source/the drain of the switching transistor; the second isolation dam is used to block the leaked current of the switching transistor; and an orthographic projection of the first heavily doped source/the first heavily doped drain on the electrical isolation layer partially overlaps with an orthographic projection of the second isolation dam on the electrical isolation layer; an orthographic projection of the second heavily doped source/the second heavily doped drain on the electrical isolation layer partially overlaps with an orthographic projection of the second isolation dam on the electrical isolation layer.

2. The semiconductor structure according to claim 1, wherein the second isolation dam is made from a doped semiconductor.

3. The semiconductor structure according to claim 1, wherein an orthographic projection of a side surface, facing the electrical isolation layer, of the first isolation dam on the electrical isolation layer is located on an orthographic projection of the second isolation dam on the electrical isolation layer.

4. The semiconductor structure according to claim 1, wherein a width of the second isolation dam is 1.2-1.5 times of a width of an opening of a top of the trench, a direction of the width is perpendicular to a side wall of the trench.

5. The semiconductor structure according to claim 1, wherein a distance between a side surface, facing the electrical isolation layer, of the first isolation dam and a side surface, facing the electrical isolation layer, of the second isolation dam is greater than or equal to 15 nm.

6. The semiconductor structure according to claim 1, wherein a height of the first isolation dam is 4-5 times of a height of the second isolation dam, a direction of the height is perpendicular to a plane where the electrical isolation layer is located.

7. The semiconductor structure according to claim 1, wherein
a gate insulation layer covering one side, away from the electrical isolation layer, of the recess according to a shape of the side of the recess;
a gate, arranged on one side, away from the electrical isolation layer, of the gate insulation layer, and located in the recess; and
a source/a drain, embedded in the active region and located on two opposite sides of the gate insulation layer, and the source/the drain being respectively connected to the channel portion.

8. The semiconductor structure according to claim 1, wherein the electrical isolation layer is made from a doped semiconductor, and a doping type of the electrical isolation layer is different from a doping type of the source/the drain of the switching transistor.

9. A method of manufacturing a semiconductor structure, comprising:
forming a semiconductor substrate; wherein the semiconductor substrate comprises a trench, an isolation region formed by a region where the trench is located, a plurality of active regions defined by the isolation region, and an electrical isolation layer;
the electrical isolation layer is located on one side, away from an opening of the trench, of the trench; and a trench bottom of the trench is spaced from the electrical isolation layer by a preset distance; and the active region is provided with a recess, the recess and the trench are provided on the same side surface of the semiconductor substrate;
filling the trench with an insulation material, so as to form a first isolation dam;
forming a plurality of switching transistors in the active region of the semiconductor substrate, each of the switching transistors being at least partially embedded in one of the plurality of active regions of the semiconductor substrate; each of the switching transistors comprises a channel portion and a source/a drain, wherein the channel portion embedded at one side, away from an opening of the recess, of the recess, the source/the drain may include: a first source/a first drain and a second source/a second drain; the first source/the first drain may include a first lightly doped source/a first lightly doped drain and a first heavily doped source/a first heavily doped drain, the first lightly doped source/the first lightly doped drain is connected to a first side of the channel portion, and the first heavily doped source/the first heavily doped drain is connected to the first lightly doped source/the first lightly doped drain; the second source/the second drain may include: a second lightly doped source/a second lightly doped drain and a second heavily doped source/a second heavily doped drain, the second lightly doped source/the second lightly doped drain is connected to a second side of the channel portion, and the second heavily doped source/the second heavily doped drain is connected to the second lightly doped source/the second lightly doped drain; and the first side and the second side of the channel portion are opposite each other;
forming a second isolation dam at least partially located between the first isolation dam and the electrical isolation layer; one end, facing the electrical isolation layer, of the first isolation dam is embedded in the second isolation dam; a doping type of the second isolation dam is different from a doping type of the source/the drain of the switching transistor; the second isolation dam is used to block the leaked current of the switching transistor; and
the orthoprojection of the first heavily doped source/the first heavily doped drain in the electrical isolation layer partially overlaps with the orthoprojection of the second isolation dam in the electrical isolation layer; the orthoprojection of the second heavily doped source/the second heavily doped drain in the electrical isolation layer partially overlaps with the orthoprojection of the second isolation dam in the electrical isolation layer.

10. The method of manufacturing a semiconductor structure according to claim 9, wherein the forming a second isolation dam comprises:
performing ion doping on a first structure portion of the semiconductor substrate, so as to form the first structure portion into at least a portion of the second isolation dam, wherein the first structure portion is located between the first isolation dam and the electrical isolation layer;
a doping type of the second isolation dam is different from a doping type of the source/the drain of the switching transistor.

11. The method of manufacturing a semiconductor structure according to claim 10, wherein the forming a second isolation dam further comprises:
defining a width of the second isolation dam by using a mask, wherein the width of the second isolation dam is greater than a width of an opening of a top of the trench, and a direction of the width is perpendicular to a side wall of the trench.

12. The method of manufacturing a semiconductor structure according to claim 11, wherein the width of the second isolation dam is 1.2-1.5 times of the width of the opening of the top of the trench.

13. The method of manufacturing a semiconductor structure according to claim 10, wherein the forming a second isolation dam further comprises:
performing ion doping on a second structure portion of the semiconductor substrate, so as to form the second structure portion into at least a portion of the second isolation dam; wherein, one end, facing the electrical isolation layer, of the first isolation dam is embedded in the second structure portion.

14. The method of manufacturing a semiconductor structure according to claim 10, wherein before forming the trench, the method of manufacturing a semiconductor structure further comprises:
forming the recess in the active region; and
depositing a gate insulation layer in the recess according to a shape of the recess, and forming a gate on one side, away from the electrical isolation layer, of the gate insulation layer, the gate being located in the recess.

15. The method of manufacturing a semiconductor structure according to claim 14, wherein the forming a plurality of switching transistors in the active region of the semiconductor substrate comprises:
forming a channel portion on one side, away from the opening of the trench, of the trench by ion implantation technology; and
forming a portion of the semiconductor substrate into the source/the drain of the switching transistor by the ion implantation technology;
wherein the source/the drain are embedded in the active region and located on two opposite sides of the gate insulation layer, and the source/the drain are respectively connected to the channel portion.

16. The method of manufacturing a semiconductor structure according to claim 9, wherein a distance between a side surface, facing the electrical isolation layer, of the first isolation dam and a side surface, facing the electrical isolation layer, of the second isolation dam is greater than or equal to 15 nm.

17. The method of manufacturing a semiconductor structure according to claim 9, wherein a height of the first isolation dam is 4-5 times of a height of the second isolation dam, a direction of the height is perpendicular to a plane where the electrical isolation layer is located.

* * * * *